United States Patent [19]

Sundaresan

[11] Patent Number: 5,554,548
[45] Date of Patent: Sep. 10, 1996

[54] METHOD OF FABRICATING A ONE-SIDED POLYSILICON THIN FILM TRANSISTOR

[75] Inventor: Ravishankar Sundaresan, Garland, Tex.

[73] Assignee: SGS-Thomson Microelectronics, Inc., Carrollton, Tex.

[21] Appl. No.: 426,851

[22] Filed: Apr. 24, 1995

Related U.S. Application Data

[62] Division of Ser. No. 193,725, Feb. 9, 1994, abandoned, which is a continuation of Ser. No. 860,983, Mar. 31, 1992, abandoned.

[51] Int. Cl.⁶ .............................................. H01L 21/336
[52] U.S. Cl. ........................... 437/41; 437/21; 437/44; 437/52; 437/913
[58] Field of Search ........................... 437/21, 40 TFI, 437/40 TFT, 41 TFI, 41 TFT, 101, 44, 913, 52

[56] References Cited

U.S. PATENT DOCUMENTS

| | | | |
|---|---|---|---|
| 4,258,465 | 3/1981 | Yasui et al. | 437/44 |
| 4,581,623 | 4/1986 | Wang | 257/67 |
| 4,686,758 | 8/1987 | Liu et al. | 437/34 |
| 4,952,825 | 8/1990 | Yoshida | 307/475 |
| 5,151,374 | 9/1992 | Wu | 437/40 TFT |
| 5,198,379 | 3/1993 | Adan | 437/41 TFT |
| 5,262,655 | 11/1993 | Ashida | 437/913 |
| 5,266,507 | 11/1993 | Wu | 437/21 |
| 5,300,446 | 4/1994 | Fujioka | 148/DIG. 105 |
| 5,348,897 | 9/1994 | Yen | 437/40 TFI |
| 5,366,909 | 11/1994 | Song et al. | 437/21 |
| 5,385,854 | 1/1995 | Batra et al. | 437/41 TFI |
| 5,403,761 | 4/1995 | Rha | 437/21 |
| 5,432,102 | 7/1995 | Cho et al. | 437/44 |

FOREIGN PATENT DOCUMENTS

| | | |
|---|---|---|
| 7132365 | 8/1982 | Japan. |
| 3260162 | 10/1988 | Japan. |
| 0214172 | 8/1989 | Japan. |
| 0260857 | 10/1989 | Japan. |
| 0023669 | 1/1990 | Japan. |
| 0094478 | 4/1990 | Japan. |
| 0197173 | 8/1990 | Japan. |

OTHER PUBLICATIONS

Fichtner et al., "Experimental Results on Submicron–Size P–Channel MOSFET's," IEEE Electron Device Letters, vol. EDL–3, No. 2, Feb, 1982.
Article entitled "A Polysilicon Transistor Technology for Large Capacity SRAMs" by S. Ikeda et al., IEDM 90, pp. 469–472, 1990.

(List continued on next page.)

Primary Examiner—Mary Wilczewski
Attorney, Agent, or Firm—Lisa K. Jorgenson

[57] ABSTRACT

A method is provided for forming a thin film transistor of a semiconductor integrated circuit, and an integrated circuit formed according to the same. A polysilicon gate electrode is formed over a portion of the integrated circuit. A gate oxide layer is formed over the gate electrode. A conformal polysilicon layer is formed over the gate oxide layer and a portion of the integrated circuit. The polysilicon layer is doped with an n-type dopant to form a channel region over the gate electrode. A screen oxide layer is formed over a portion of the polysilicon layer substantially over the gate electrode. The polysilicon layer not covered by the screen oxide layer is doped with a p⁻-type dopant to form a lightly doped drain region on each side of the channel region. A photoresist layer is formed over a portion of the screen oxide layer and one of the lightly doped drain regions. The polysilicon layer not covered by the photoresist layer is doped with a p⁺-type dopant. The photoresist layer is then removed. A conformal oxide layer is formed over the integrated circuit. The conformal oxide layer is then patterned and etched to form sidewall spacers on the sides of the screen oxide layer and the polysilicon layer adjacent to the screen oxide layer. The polysilicon layer not covered with the screen oxide layer or the sidewall oxide spacers is doped with a p⁺-type dopant. The screen oxide layer and the sidewall oxide spacers are then removed.

15 Claims, 1 Drawing Sheet

OTHER PUBLICATIONS

Article entitled "A 5.9 µm$^2$ Super Low Power SRAM Cell Using a New Phase–Shift Lithography" by T. Yamanaka et al., IEDM 90, pp. 477–480, 1990.

Ohkubo et al., "16Mbit SRAM Cell Technologies for 2.0V Operations," IEEE, IEDM pp. 91–481 91–484.

Liu et al., "Inverted Thin–Film Transistors with a Simple Self–Aligned Lightly Doped Drain Structure," IEEE Transactions on Electron Devices, vol. 39, No. 12, Dec. 1992.

Liu et al., "High Reliability and High Performace 0.35 µm Gate–Inverted TFT's for 16Mbit SRAM Appliations Using Self–Aligned LDD Structures," 1992 IEEE, IEDM 92–223 to 92–826.

Hayashi et al., "A High Performance Polysilicon TFT Using RTA and Plasma Hydrogenation Applicable to Highly Stable SRAMs of 16Mbit and Beyond," 1992 Symposium on VLSI Technology Digest of Technical Papers, 1992 IEEE, pp. 36–37.

METHOD OF FABRICATING A ONE-SIDED POLYSILICON THIN FILM TRANSISTOR

This is a division, of application Ser. No. 08/193,725, filed Feb. 9, 1994, now abandoned, which is a continuation of application Ser. No. 07/860,983, filed Mar. 31, 1992, now abandoned.

FIELD OF THE INVENTION

The present invention relates generally to semiconductor integrated circuit processing, and more specifically to a method of forming a one-sided polysilicon thin film transistor.

BACKGROUND OF THE INVENTION

The basic SRAM cell can be formed using cross-coupled CMOS inverters having 2 each n-channel and p-channel transistors. The cell is accessed by, typically, 2 n-channel control gates for a standard SRAM cell and 4 control gates for 2-port memory devices. To conserve physical layout space, the p-channel transistors are often replaced with resistive loads.

Use of the p-channel transistors as the load devices for the SRAM cell, however, results in the cell having better electrical characteristics. Such cells are faster than those using resistive loads, since the p-channel transistors provide a higher drive current than high resistance devices. Also, use of p-channel transistors gives higher immunity to soft errors, such as those caused by alpha particle impacts and noise. The primary disadvantage of SRAM cells incorporating p-channel load transistors is that the layout area for each cell is significantly larger than those using resistive loads. This reduces device density and increases chip costs.

Bottom-gated polysilicon PMOS transistors, or an inverted form of the transistors, are often used as the p-channel transistors or load devices in the SRAM cell. Stacking the p-channel transistors over the n-channel transistors increases device density. Today, the polysilicon PMOS transistors are used, for example, as the load devices in four megabit SRAM cells to improve the stability of the cell and reduce the cell's stand-by current. These load devices, generally termed thin film transistors, may be built in 10 to 100 nanometers of polysilicon deposited on top of an oxide layer. In most applications, the gate of the thin film transistor is shielded at the bottom of the transistor body by a layer of oxide as shown in the prior art FIG. 1. After the gate 50 formation, a gate oxide layer is formed over the gate thus encapsulating the gate. A thin film of polysilicon 52 is deposited covering the gate. The thin film of polysilicon is appropriately doped to form an n-channel region above the gate and p* source and drain regions adjacent to the n-channel region and above the gate.

The typical bottom-gated thin film transistor, however, has a high grain-junction leakage current. The presence of grain boundary traps between, for example, the $p^+$ drain region and the n-channel region causes field-enhanced generation current. This field enhanced current causes the leakage or off-state current of the cell to be high.

Several methods have been proposed to control the field-enhanced current in the bottom-gated polysilicon thin film transistor. See, for example, A. POLYSILICON TRANSISTOR TECHNOLOGY FOR LARGE CAPACITY SRAMs, by Ikeda et al, IEDM 469–472, 1990 and A 59 um² SUPER LOW POWER SRAM CELL USING A NEW PHASE-SHIFT LITHOGRAPHY, by T. Yamanaka et al, IEDM 477–480, 1990. A gate to drain off-set structure of the polysilicon PMOS transistor is proposed whereby the leakage current and the stand-by dissipation power required for the memory cell are reduced to more acceptable levels.

As shown in prior art FIG. 2, the heavily doped $p^+$ drain region 54 is offset from the transistor gate 50. However, the lightly doped n-channel region which extends further over the transistor gate has the same doping concentration as the gate which results in some additional current loss. It would therefore be desirable to provide an improved off-set structure which reduces the drain electric field without compromising the drive current. It would further be desirable to form the improved structure utilizing current fabrication techniques easily adapted for use with standard integrated circuit process flows.

SUMMARY OF THE INVENTION

The invention may be incorporated into a method for forming a semiconductor device structure, and the semiconductor device structure formed thereby, by forming a first conductive structure over a portion of the integrated circuit. A first dielectric layer is formed over the first conductive structure. A polysilicon layer, having a first and a second end, is formed over the first dielectric layer. A channel region is formed in the polysilicon layer substantially over the first conductive structure. A source region is formed in the polysilicon layer adjacent to the first end of the channel region. A LDD region is formed in the polysilicon layer adjacent to the second end of the channel region. A drain region is formed in the polysilicon layer adjacent to the LDD region.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
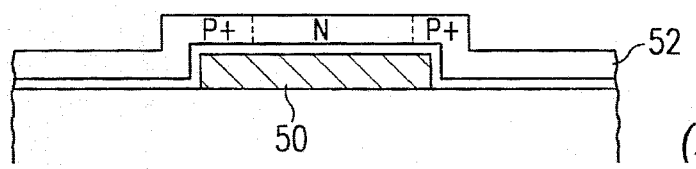
FIG. 1 illustrates the prior art bottom-gated polysilicon PMOS transistor.
Figure 2:
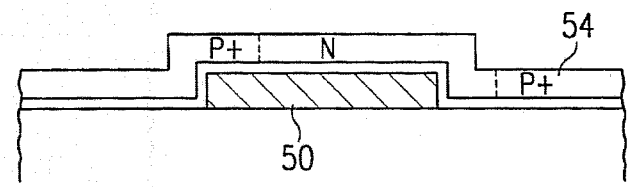
FIG. 2 illustrates the prior art off-set gate to drain structure of the polysilicon PMOS transistor.
Figure 3:
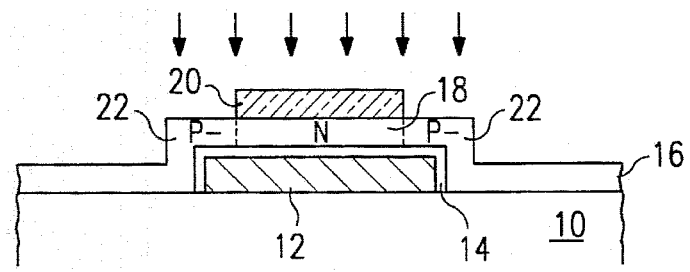
FIGS. 3–6 are the cross-sectional views of the fabrication of a semiconductor device structure according to the present invention.

Referring to FIG. 3, an integrated circuit device is to be formed on a dielectric layer 10. A polysilicon gate electrode 12 is formed over the substrate 10. The polysilicon gate 12 is appropriately doped with a p-type dopant such as boron or an n-type dopant such as arsenic or phosphorous as known in the art. A dielectric layer 14 is formed over the integrated circuit encapsulating the gate electrode 12. Layer 14 may typically be an oxide or an oxide/nitride composite. A substantially conformal polysilicon layer 16 is then formed over the device to form the source/drain and channel regions of a transistor. This structure represents a bottom-gated transistor. The transistor is inverted from a traditional transistor structure which has a gate on top with a source/drain and channel region in the substrate. This structure represents a polysilicon PMOS thin film transistor having a gate on the bottom with the source/drain and channel regions overlying the gate in a second polysilicon layer.

The polysilicon layer 16 is appropriately doped with an n-type dopant such as phosphorous or a p-type dopant such as boron to adjust the threshold voltage to a desired value. The dopant used to adjust the threshold voltage forms the n-channel region 18 overlying the gate 12. An oxide layer is then formed over the polysilicon layer 16, patterned and etched to form a screen oxide region 20. The screen oxide 20 is formed over the region of the polysilicon layer 16 which is to remain doped with an n-type dopant forming the n-channel region 18. The screen oxide layer 20 has a thickness of between approximately 1500 to 3000 angstroms. Alternatively, the screen oxide layer may comprise an oxide/nitride stack. The purpose of the screen oxide layer 20 is to protect the n-channel region from subsequent implants. A blanket p⁻ implant is performed as represented by the arrows to form the lightly doped drain (LDD) p⁻ regions 22 on either side of the n-channel region 18.

Figure 4:
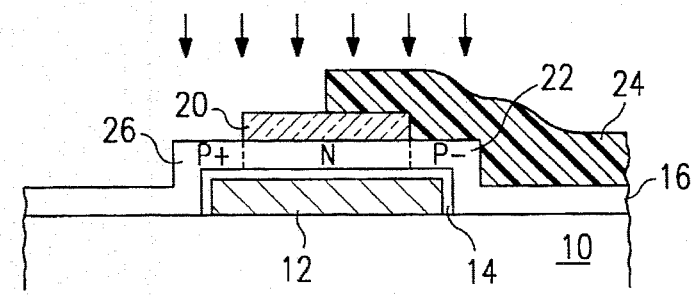

Referring to FIG. 4, a photoresist layer 24 is formed over the device and patterned to expose a portion of the screen oxide layer 20 and the source region 22 in the polysilicon layer 16. A heavily doped p⁺ source region 26 is formed by implantation as represented by the arrows. The dopant used to form the heavily doped source region may be boron fluoride ($BF_2$) to a concentration of $10^{20}/cm^3$. This p⁺ source region will typically be connected to Vcc and is on top of the gate and thus does not contribute to any series resistance.

Figure 5:
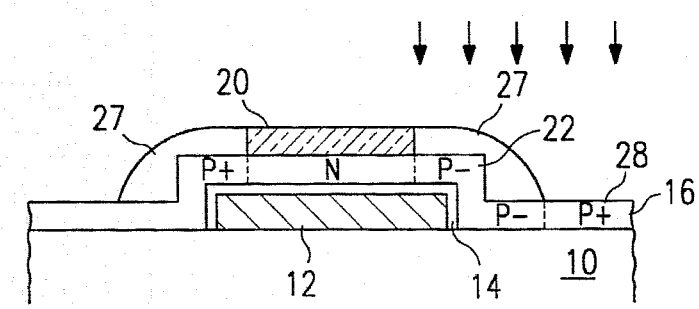

Referring to FIG. 5, the photoresist layer 24 is removed. An oxide layer is deposited over the device. Sidewall oxide spacers 27 are then formed by an etchback of the oxide layer. A blanket p⁺ implant is performed as represented by the arrows to form a heavily doped p⁺ drain region 28 in polysilicon layer 16 which is off-set from the gate 12. The length of the sidewall spacers 27 will define the length of the p⁻ LDD region 22. The transistor leakage current will be proportional to the length of the LDD region 22. Thus, a longer p⁻ type LDD region 22 will lower the leakage current.

Figure 6:
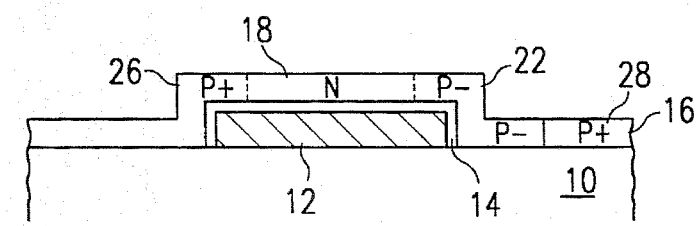

Referring to FIG. 6, the screen oxide region 20 and the sidewall spacers 27 are removed. A wet etch process may be used using the polysilicon layer 16 as an etch stop. The screen oxide no longer contributes to the topography since it is removed. Conventional planarization processes may be performed followed by contact via and metallization processes. An offset gate to drain structure is formed starting with a traditional polysilicon PMOS thin film transistor. A p⁺ source/drain region and an n-channel region are formed. In this invention, however, a p⁻ LDD region is formed between the n-channel and the more heavily doped p⁺ drain. This structure will reduce the field enhanced junction leakage. The leakage or off-state current of the transistor will be minimized providing for more stable electrical characteristics.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A method of forming a thin film transistor of a semiconductor integrated circuit, comprising:

forming a first conductive structure over a portion of the integrated circuit;

forming a first dielectric layer over the first conductive structure;

forming a polysilicon layer, having a first dopant therein, over the first dielectric layer;

forming a second dielectric layer over a portion of the polysilicon layer substantially over the first conductive structure;

implanting a second dopant into the polysilicon layer not covered by the second dielectric layer;

forming a photoresist layer over a portion of the second dielectric layer and a portion of the polysilicon layer;

implanting a third dopant into the polysilicon layer not covered by the second dielectric layer and the photoresist layer;

removing the photoresist layer;

forming oxide sidewall spacers adjacent to the second dielectric layer and covering a portion of the polysilicon layer adjacent to the second dielectric layer; and implanting the third dopant into the polysilicon layer not covered by the second dielectric layer and the sidewall spacers.

2. The method of claim 1, wherein the first conductive structure comprises a gate electrode of a field effect device.

3. The method of claim 1, wherein the first conductive structure has a thickness of between approximately 1000 to 2500 angstroms.

4. The method of claim 1, wherein the first dielectric layer comprises a gate oxide having a thickness of between approximately 200 to 400 angstroms.

5. The method of claim 1, wherein the first dielectric layer comprises an oxide/nitride composite having a thickness of between approximately 200 to 400 angstroms.

6. The method of claim 1, wherein the first dopant comprises an n-type dopant.

7. The method of claim 1, wherein the second dielectric layer comprises an oxide.

8. The method of claim 1, wherein the second dopant comprises a p-type dopant implanted at a low concentration.

9. The method of claim 1, wherein the polysilicon layer has a thickness of between approximately 300 to 800 angstroms.

10. The method of claim 1, wherein the third dopant comprises a p-type dopant implanted at a high concentration.

11. A method of forming a thin film transistor of a semiconductor integrated circuit, comprising:

forming a polysilicon gate electrode over a portion of the integrated circuit;

forming a gate oxide layer over the gate electrode;

forming a conformal polysilicon layer over the gate oxide layer and a portion of the integrated circuit;

doping the polysilicon layer with an n-type dopant to form a channel region over the gate electrode;

forming a screen oxide layer over a portion of the polysilicon layer substantially over the gate electrode;

implanting a p-type dopant at a low concentration into the polysilicon layer not covered by the screen oxide layer to form a lightly doped drain region on each side of the channel region;

forming a photoresist layer over a portion of the screen oxide layer and one of the lightly doped drain regions;

implanting a p-type dopant at a high concentration into the polysilicon layer not covered by the photoresist layer;

removing the photoresist layer;

forming a conformal oxide layer over the integrated circuit;

patterning and etching the conformal oxide layer to form sidewall spacers on the sides of the screen oxide layer and the polysilicon layer adjacent to the screen oxide layer;

implanting a p-type dopant at a high concentration into the polysilicon layer not covered with the screen oxide layer or the sidewall oxide spacers; and removing the screen oxide layer and the sidewall oxide spacers.

12. The method of claim 11, wherein the n-type dopant comprises phosphorous.

13. The method of claim 11, wherein the step of implanting a p-type dopant at a low concentration comprises implanting $BF_2$ wherein the implanted polysilicon layer has a dopant concentration of between approximately $10^{12}$ to $10^{13}/cm^2$.

14. The method of claim 11, wherein the step of implanting a p-type dopant at a high concentration comprises implanting $BF_2$ wherein the implanted polysilicon layer has a dopant concentration of approximately $10^{15}/cm^{2/}$.

15. A method of forming a thin film transistor of a semiconductor integrated circuit, comprising:

forming a first conductive structure over a portion of the integrated circuit;

forming a first dielectric layer over the first conductive structure;

forming a polysilicon layer, having a first and a second end, over the first dielectric layer;

forming a first masking region over the polysilicon layer to define a channel region in the polysilicon layer having a first and a second end and lying substantially over the first conductive structure;

forming a LDD region in the polysilicon layer adjacent to the first end of the channel region and aligned with the first masking region;

forming a source region in the polysilicon layer adjacent to the second end of the channel region and aligned with the first masking region;

forming sidewall spacers adjacent the first masking region and covering a portion of the source region and a portion of the LDD region; and forming a drain region in the polysilicon layer adjacent to the LDD region and aligned with the sidewall spacer.

* * * * *